United States Patent
Hong et al.

(10) Patent No.: US 7,440,302 B2
(45) Date of Patent: Oct. 21, 2008

(54) FERROELECTRIC INFORMATION STORAGE DEVICE AND METHOD OF WRITING/READING INFORMATION

(75) Inventors: Seung-bum Hong, Seongnam-si (KR); Jin-gyoo Yoo, Seongnam-si (KR); Ju-hwan Jung, Seoul (KR); Simon Buehlmann, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 10 days.

(21) Appl. No.: 11/500,890

(22) Filed: Aug. 9, 2006

(65) Prior Publication Data

US 2007/0047290 A1 Mar. 1, 2007

(30) Foreign Application Priority Data

Sep. 1, 2005 (KR) .................. 10-2005-0081318

(51) Int. Cl.
*G11C 11/18* (2006.01)
*G11C 11/00* (2006.01)
*G11C 11/14* (2006.01)
*G11C 11/15* (2006.01)

(52) U.S. Cl. .................. 365/9; 365/158; 365/171; 365/173

(58) Field of Classification Search .......... 365/158, 365/171, 173, 9
See application file for complete search history.

(56) References Cited

U.S. PATENT DOCUMENTS

| | | | | |
|---|---|---|---|---|
| 5,237,529 | A * | 8/1993 | Spitzer | 365/158 |
| 6,104,632 | A * | 8/2000 | Nishimura | 365/158 |
| 6,172,902 | B1 * | 1/2001 | Wegrowe et al. | 365/158 |
| 6,577,526 | B1 * | 6/2003 | Schwarzl | 365/158 |
| 6,807,094 | B2 * | 10/2004 | Saito et al. | 365/158 |
| 6,870,761 | B2 * | 3/2005 | Johnson | 365/158 |
| 7,027,322 | B2 * | 4/2006 | Suzuki et al. | 365/158 |

* cited by examiner

*Primary Examiner*—Trong Phan
(74) *Attorney, Agent, or Firm*—Sughrue Mion, PLLC

(57) ABSTRACT

An information storage device includes a ferroelectric layer having a first surface and a second surface opposite the first surface. A common electrode layer is formed on the first surface of the ferroelectric layer. At least two conductive track layers separated from each other are positioned on the second surface of the ferroelectric layer. A conductive roller that has two opposite ends supported by the conductive track layers is provided. The conductive roller is movable along a conductive track. A ferromagnetic layer creates a magnetic field on the conductive roller.

15 Claims, 8 Drawing Sheets

FERROELECTRIC INFORMATION STORAGE DEVICE AND METHOD OF WRITING/READING INFORMATION

CROSS-REFERENCE TO RELATED PATENT APPLICATION

This application claims the benefit of Korean Patent Application No. 10-2005-0081318, filed on Sep. 1, 2005, in the Korean Intellectual Property Office, the disclosure of which is incorporated herein in its entirety by reference.

BACKGROUND OF THE INVENTION

1. Field of the Invention

The present invention relates to a ferroelectric information storage device, and more particularly, to a ferroelectric information storage device, using a conductive roller and methods of writing/reading information to/from the ferroelectric information storage device. More particularly the conductive roller could be nano-sized.

2. Description of the Related Art

A conventional probe-type ferroelectric information storage device uses a probe that is used in a scanning tunneling microscope (STM), an atomic force microscope (AFM), or a scanning probe microscope (SPM). The probe forms an electric field in a ferroelectric film to control the direction of polarization in the ferroelectric film (See U.S. Pat. No. 6,854,648).

A conventional information storage device using a probe typically includes a recording medium having a ferroelectric layer. A probe that records/reproduces information to/from the recording medium is in a state that it contacts or does not contact the recording medium. A scanner operates the probe. The scanner includes a cantilever supporting the probe and a Micro Electro Mechanical Systems (MEMS) actuator operating the cantilever.

The conventional information storage device including the probe and the scanner operating the probe has a complicated structure, resulting in high manufacturing cost. In particular, when information is recorded/reproduced in a state that the probe contacts the recording medium, the probe and the recording medium suffer from wear and tear.

When information is recorded and reproduced in a state that the probe does not contact the recording medium, a control unit is required to maintain a constant distance between the probe and the recording medium. Due to the use of the control unit, the information storage device suffers high manufacturing costs and becomes bulky.

SUMMARY OF THE INVENTION

The present invention provides a simple, compact, lightweight ferroelectric information storage device.

According to an aspect of the present invention, there is provided an information storage device including: a ferroelectric layer having a first surface and a second surface opposite the first surface; a common electrode layer formed on the first surface of the ferroelectric layer; at least two conductive track layers separated from each other and formed on the second surface of the ferroelectric layer; a conductive roller that has two opposite ends supported by the conductive track layers and is movable along a conductive track; and a ferromagnetic layer creating a magnetic field on the conductive roller.

An information storage device may have an integrated array of multiple basic units, each basic unit including: a ferroelectric layer having a first surface and a second surface opposite the first surface; a common electrode layer formed on the first surface of the ferroelectric layer; at least two conductive track layers separated from each other and formed on the second surface of the ferroelectric layer; a conductive roller that has two opposite ends supported by the conductive track layers and is movable along a conductive track; and a ferromagnetic layer creating a magnetic field on the conductive roller.

In a specific enhancement, the roller is a nanotube.

According to another aspect of the present invention, there is provided a method of writing and reading information, including the steps of: generating a Lorentz's force on a conductive roller that is movable over a first surface of a ferroelectric layer to cause the roller to move over the ferroelectric layer; applying a predetermined pulse voltage corresponding to recorded information to the ferroelectric layer through the conductive roller to form a polarization domain having a predetermined pattern in the ferroelectric layer and writing desired information to the polarization domain; and detecting an electric signal from the polarization domain having the predetermined pattern in the ferroelectric layer and reading the recorded information from the polarization domain.

In a specific enhancement, the current is applied to and a magnetic field is created on the conductive roller in order to generate the Lorentz's force. A ferromagnetic layer is formed on a second surface of the ferroelectric layer to create the magnetic field.

The step of reading the recorded information includes the steps of: controlling a carrier channel of the conductive roller using the polarization domain formed in the ferroelectric layer while moving the conductive roller over the ferroelectric layer; applying a predetermined read voltage to the conductive layer; and detecting current whose magnitude varies according to a carrier channel controlled by the polarization domain.

In a specific enhancement, the read voltage is a pulse voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
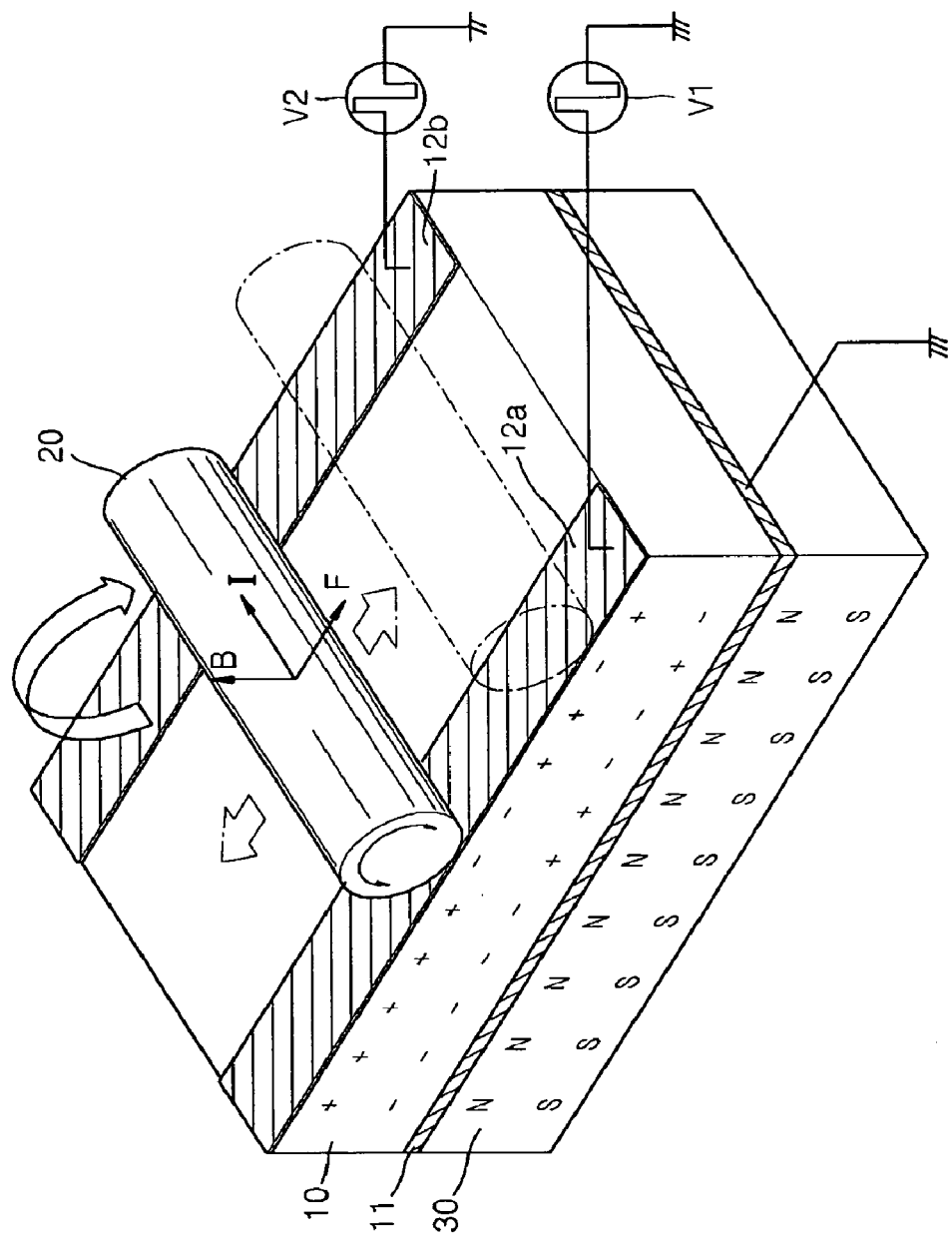
FIG. 1 illustrates an example of an information storage device according to an embodiment of the present invention.

FIG. 1 is a perspective view schematically illustrating the basic construction of an information storage device according to an embodiment of the present invention. Referring to FIG. 1, the information storage device includes a ferroelectric layer 10. An electrode 11 is formed on a first (bottom) surface of the ferroelectric layer 10. First and second parallel conductive track layers 12a and 12b are disposed on a second (top) surface of the ferroelectric layer 10. A conductive roller 20 is formed on the first and second track layers 12a and 12b and extends in a direction orthogonal to the first and second track layers 12a and 12b.

Pulse driving voltages V1 and V2 are applied to the first and second track layers 12a and 12b. The roller 20 is supported by the first and second track layers 12a and 12b as a simply supported beam and can move by rolling over the first and second track layers 12a and 12b. A ferromagnetic layer 30 is disposed below the ferroelectric layer 10 and creates a magnetic field on the roller 20. The electrode 11 is sandwiched between the ferroelectric layer 10 and ferromagnetic layer 30. The roller 20 sticks to the ferroelectric layer 10 due to Van Der Waals and electrostatic forces.

The polarization of the ferroelectric layer 10 is perpendicular to the first and second surfaces thereof. Different patterns of pulse driving voltages V1 and V2 are applied to the track layers 12a and 12b. The common electrode 11 acts as a ground. When an electric potential is created between the first and second track layers 12a and 12b, an electric current flows across the roller 20 Lorentz's force is generated between the electric current and the magnetic field created by the ferromagnetic layer 30 according to the Fleming's left-hand rule. The direction of the Lorentz's force is determined by the directions of the magnetic field and current.

In the current embodiment, because N and S poles in a magnetic field exist at upper and lower portions of the ferromagnetic layer 30, respectively, the direction of Lorentz's force is determined according to the direction of the current. The direction that the roller 20 moves is determined according to the direction of Lorentz's force. Of course, the N and S poles may be positioned at the lower and upper portions of the ferromagnetic layer 30.

Figure 2:
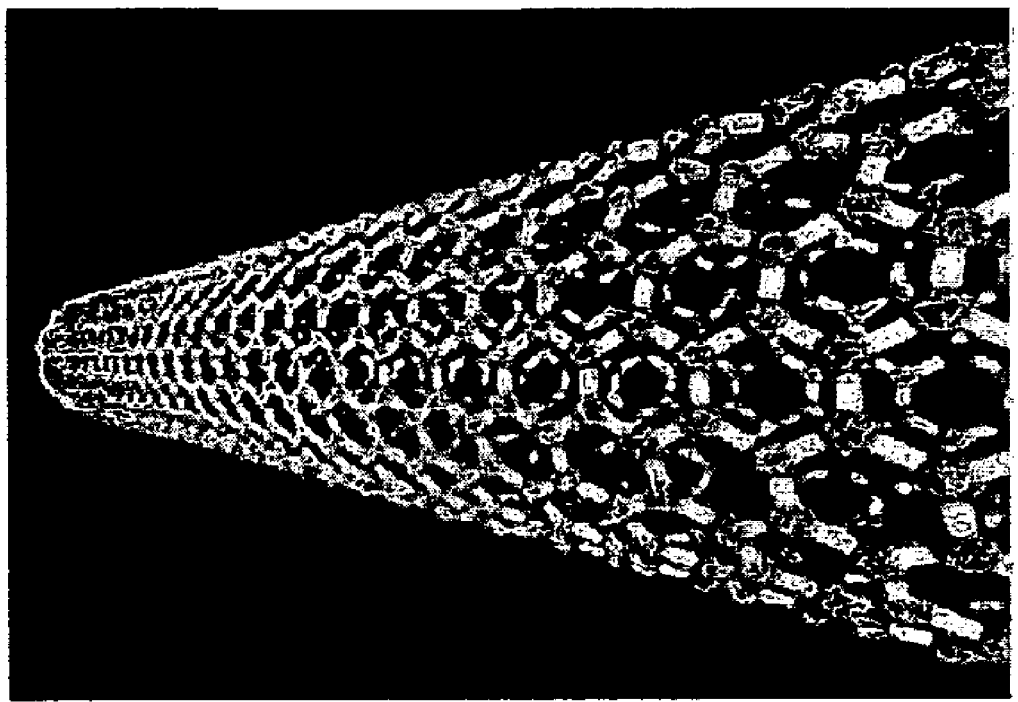
FIG. 2 illustrates an example of a nanotube that can be used in an information storage device according to an embodiment of the present invention.

The roller 20 may be formed of conductive diamond like carbon (DLC), carbon nanotube (CNT) having a meshed crystal structure as shown in FIG. 2, or other conductive material with appropriate strength and elastic restoration force.

An example of writing and reading operations of an information storage device will now be described with reference to FIGS. 3A-3C.

Figure 3A:
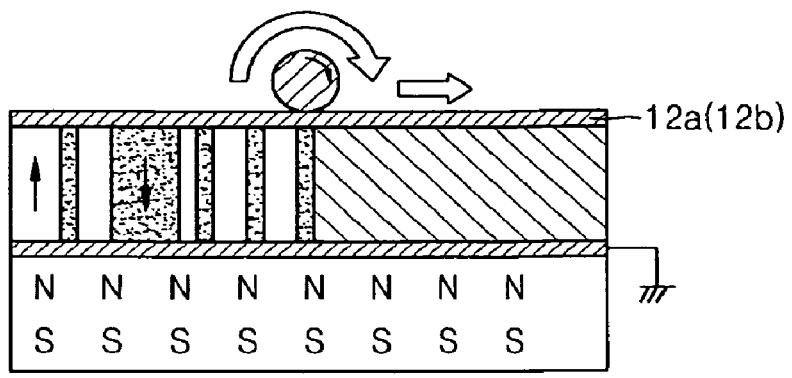
FIGS. 3A-3C illustrate a method of writing information according to an embodiment of the present invention.

FIG. 3A schematically illustrates a state in which the polarization of the ferroelectric layer 10 is changed due to a potential difference between the common electrode 11 acting as a ground and the roller 20 when the Lorentz's force causes the roller 20 to roll during write operation. The potential difference should be greater than coercive voltage needed to induce polarization switching in the ferroelectric layer 10. The Lorentz's force used to move the roller 20 is generated due to a potential difference between the first and second track layers 12a and 12b. Thus, when there is no potential difference therebetween, no Lorentz's force is generated. In this case, when a voltage between the common electrode 11 and the roller 20 is greater than a coercive voltage needed to induce polarization switching regardless of the presence of the potential difference between the first and second track layers 12a and 12b, the polarization direction of the ferroelectric layer 10 is determined according to the direction of an electric field applied to the ferroelectric layer 10. An example of a write operation will be described later in more detail with reference to FIG. 4.

Figure 3B:
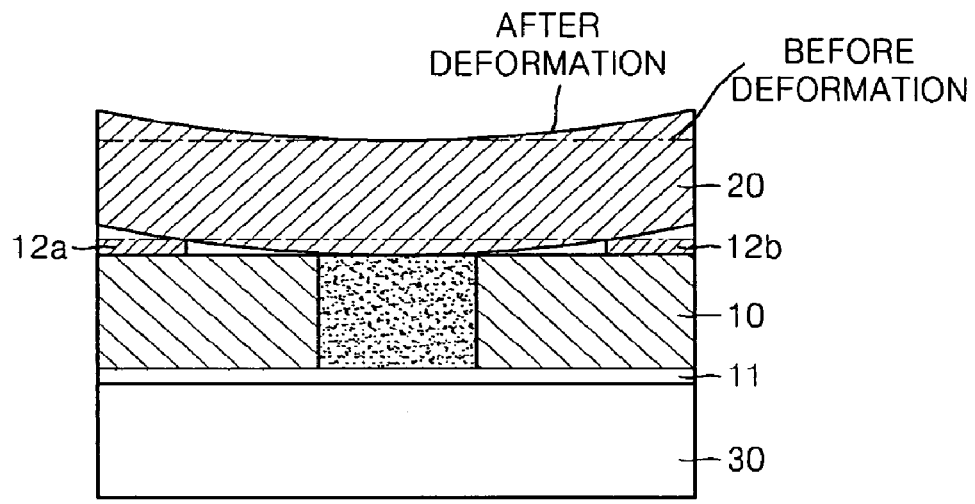

FIG. 3B illustrates a state in which the ferroelectric layer 10 is in contact with a central portion of the roller 20 bent due to a capacitive force, i.e., electrostatic force between the electrode 11 and the roller 20. Polarization switching occurs in a portion of the ferroelectric layer 10 in contact with the roller 20. The polarization switching also occurs in a portion of the ferroelectric layer 10 beneath the track layers 12a and 12b. Polarization may occur in the remaining portion of the ferroelectric layer 10 between the track layers 12a and 12b depending on the size of a gap, more precisely, the magnitude of capacitance of the gap. When a voltage drop is small because the size of gap is very small so capacitance is sufficiently large, polarization switching can also occur at the remaining portion.

Figure 3C:
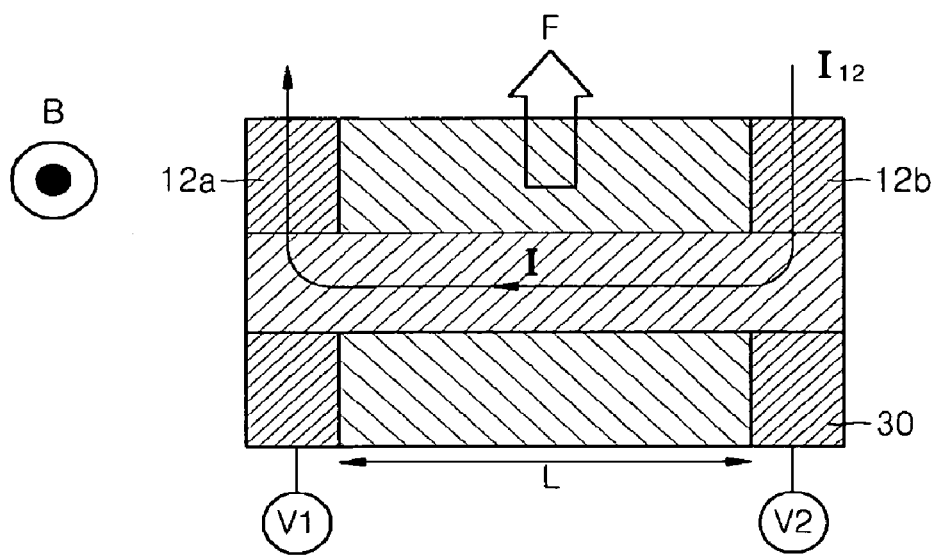

FIG. 3C is a plan view illustrating the direction of Lorentz's force F determined according to the direction of flow of magnetic field B and electric current I in an information storage device according to an embodiment of the present invention. Because the presence of magnetic field and electric current passing through the magnetic field causes Lorentz's force to appear, a potential difference must exist between the first and second track layers 12a and 12b in order to generate the Lorentz's force. When the potential difference exists, the roller 20 moves by rolling. At the same time, when the potential difference between the common electrode and the track layers 12a and 12b the roller 20 is greater than a coercive voltage needed to induce polarization switching, information is written while the roller 20 is moving.

That is, the potential difference between the first and second track layers 12a and 12b causes the roller 20 to move. When the potential difference between the common electrode 11 and either the track layers 12a and 12b or the roller 20 is greater than the coercive voltage, information is written to a recording medium. The information is recorded according to the direction of polarization of the ferroelectric layer 10 that is determined by the polarities of the first and second track layers 12a and 12b and the common electrode 11. When the common electrode 11 is grounded, the voltages V1 and V2 applied to the first and second track layers 12a and 12b are AC pulse voltages.

The ferromagnetic layer 30 disposed below the ferroelectric layer 10 creates a magnetic field on the conductive roller 20 through which electric current flows. Thus, the magnetic field created by the ferromagnetic layer 30 interacts with the electric current flowing across the roller 20 to generate Lorentz's force which in turn causes the roller 20 to move in one direction. The following Equation defines the relationship between electric energy and kinetic energy of a roller having mass m and length L within magnetic field B under ideal conditions where neither slip nor stiction is observed.

$$I_{12}LBvdt = \frac{1}{2}mv^2 + \frac{1}{2}I_m\omega^2$$

where $I_m = mR^2$ for thin wall cylinder (roller), $v = R\omega$ m: mass of cylinder L: length of cylinder R: radius of cylinder ω: angular velocity of cylinder $I_{12}$: current between 1st and 2nd track layers through cylinder thus $$dv = \frac{I_{12}LB}{m}dt$$

Thus, according to calculations made under the ideal conditions, the roller moves at constant velocity due to pulse current $I_{12}$ and pulse current $-I_{12}$ of opposite polarity is applied to cease the motion of the roller.

M. R. Falvo et al., have found that a force F, i.e., ILB is 0.006N/m*L and allows rolling movement of a cylinder ("Nanometer-scale rolling and sliding of carbon nanotubes," Nature 397, 236-238). According to a paper written by B. Q. Wei et al. ("Reliability and current carrying capacity of carbon nanotubes," Appl. Phys. Lett. 79(8), 1172-1174 (2001)), current of about 10 mA can be induced in a nanotube (cylinder) roller when a magnetic field is 0.7 T and the product IB of current and the magnetic field is 0.007. Thus, it is possible to move the roller using current of about 10 mA.

Figure 4:
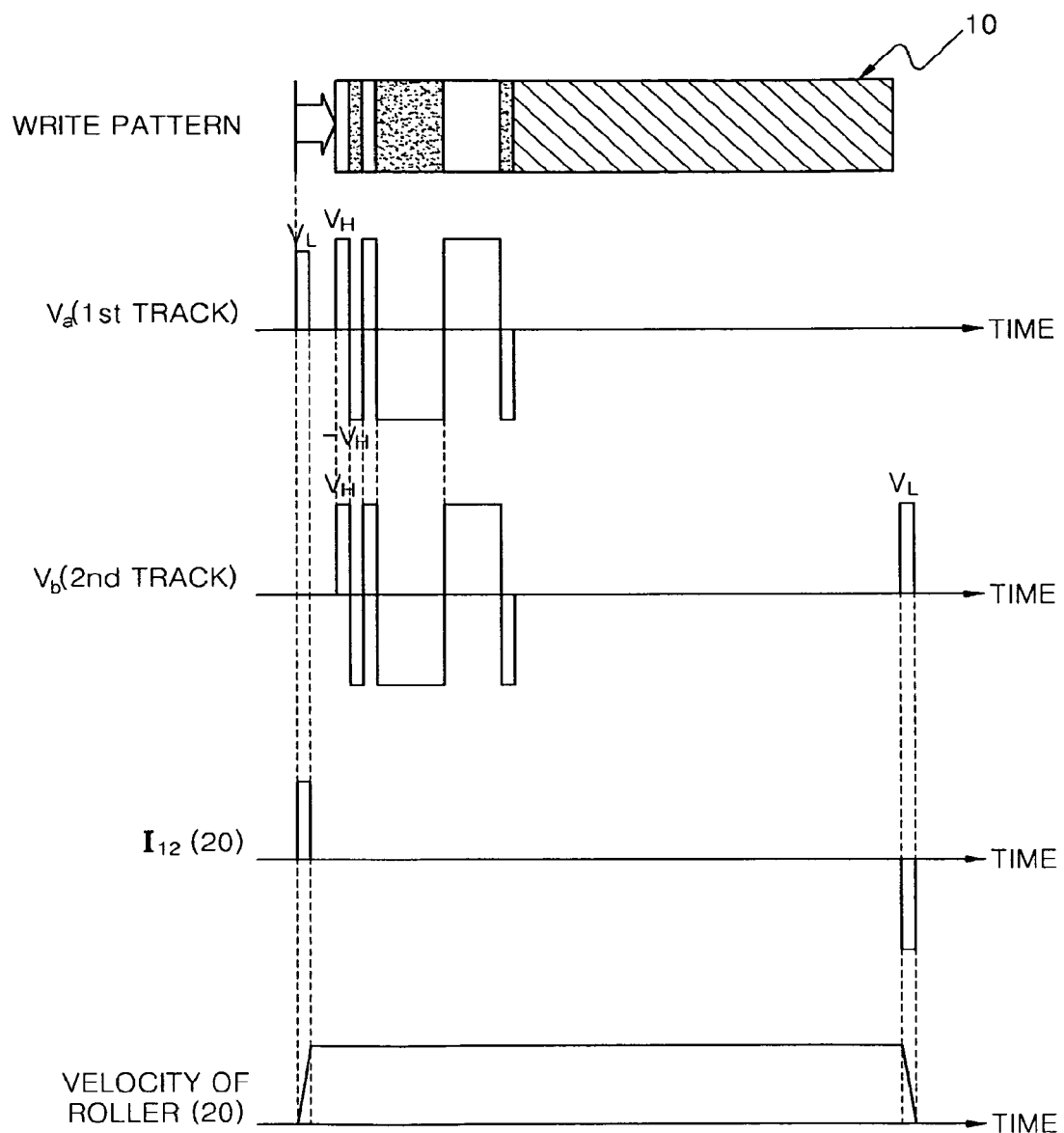
FIG. 4 is a timing chart for explaining a method of writing information according to an embodiment of the present invention.

The write operation using polarization switching will now be described with reference to FIG. 4 that is a timing chart for explaining a method of writing information according to an embodiment of the present invention. Dark and light areas in a write pattern indicate polarization domains (areas) having different directions. First, to obtain the write pattern, i.e., written information, a first pulse voltage $V_L$ is applied to the first track layer 12a. Then, current $I_{12}$ (in FIG. 3C) is flowing between the first and second track layers 12a and 12b and the resulting Lorentz's force causes the roller 20 to move at constant velocity (See VELOCITY OF ROLLER IN FIG. 4). A voltage needed to move the roller 20 should be lower than a coercive voltage needed to induce polarization switching in the ferroelectric layer 10 under ideal conditions that there is neither friction nor stiction.

After application of the first pulse voltage $V_L$, a pulse voltage $V_H$ higher than coercive voltage is commonly applied to the first and second track layers 12a and 12b while the roller 20 is moving. In this case, because no potential difference occurs between the first and second track layers 12a and 12b, i.e., the current $I_{12}$ is zero, the current $I_{12}$ does not affect the movement of the roller 20. On the other hand, a voltage $V_H$ higher than a threshold voltage is applied to the ferroelectric layer 10 to form a polarization domain having a direction corresponding to the direction of line of electric force in the ferroelectric layer 10. Then, pulse voltage $-V_H$ of opposite polarity is applied to the first and second track layers 12a and 12b to form a polarization domain polarized in a different direction in the ferroelectric layer 10. By applying pulse voltages in this way, it is possible to form polarization domains having a pattern as shown in FIG. 4 in the ferroelectric layer 10. Finally, when a pulse voltage $V_L$ having the same level as the first pulse voltage $V_L$ applied for activating the roller 20 is applied to the second track layer 12b, a Lorentz's force is generated in the opposite direction to the direction in which the roller 20 moves and causes the roller 20 to stop. When a pulse of opposite polarity is applied again, the roller 20 comes back to the original position.

Figure 5A:
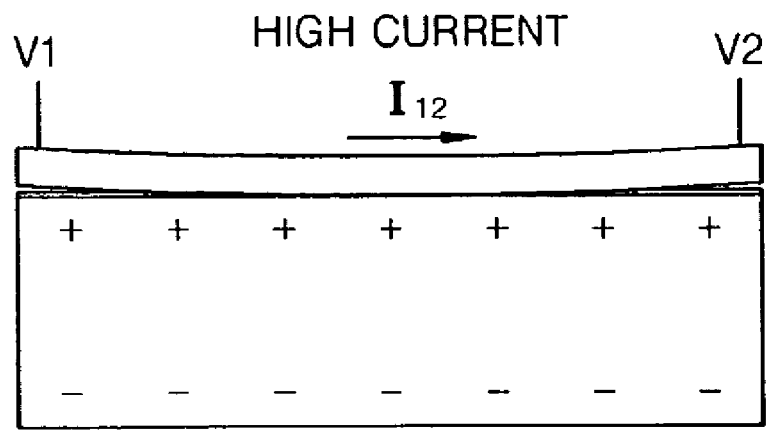
FIGS. 5A and 5B are diagrams for explaining the principle of reading information from an information storage device according to an embodiment of the present invention.
Figure 5B:
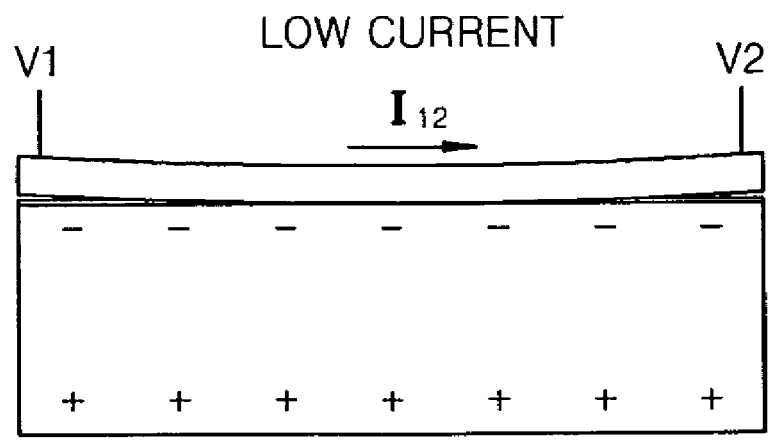

Another feature of an information storage device according to an embodiment of the present invention is that the roller 20 utilized for polarization switching acts as a conduction channel in which a carrier density and/or mobility is controlled during read operation. When the roller 20 rotates, the carrier density and/or mobility is controlled by a depletion layer generated to one side away from the central portion of the roller 20 in contact with the ferroelectric layer 10 due to polarization switching in the ferroelectric layer 10. FIGS. 5A and 5B are diagrams for explaining the principle of reading information from an information storage device according to an embodiment of the present invention. Referring to FIGS. 5A and 5B, during read operation, the roller 20 acts as a carrier channel and the ferroelectric layer 10 acts as a gate controlling the flow of the carriers. The first and second track layers 12a and 12b supporting two ends of the roller 20 serve as a source and a drain for a transistor, respectively. Thus, current $I_{12}$ is at a high or low level depending on the polarization of the ferroelectric layer 10 in contact with the roller 20.

Figure 6:
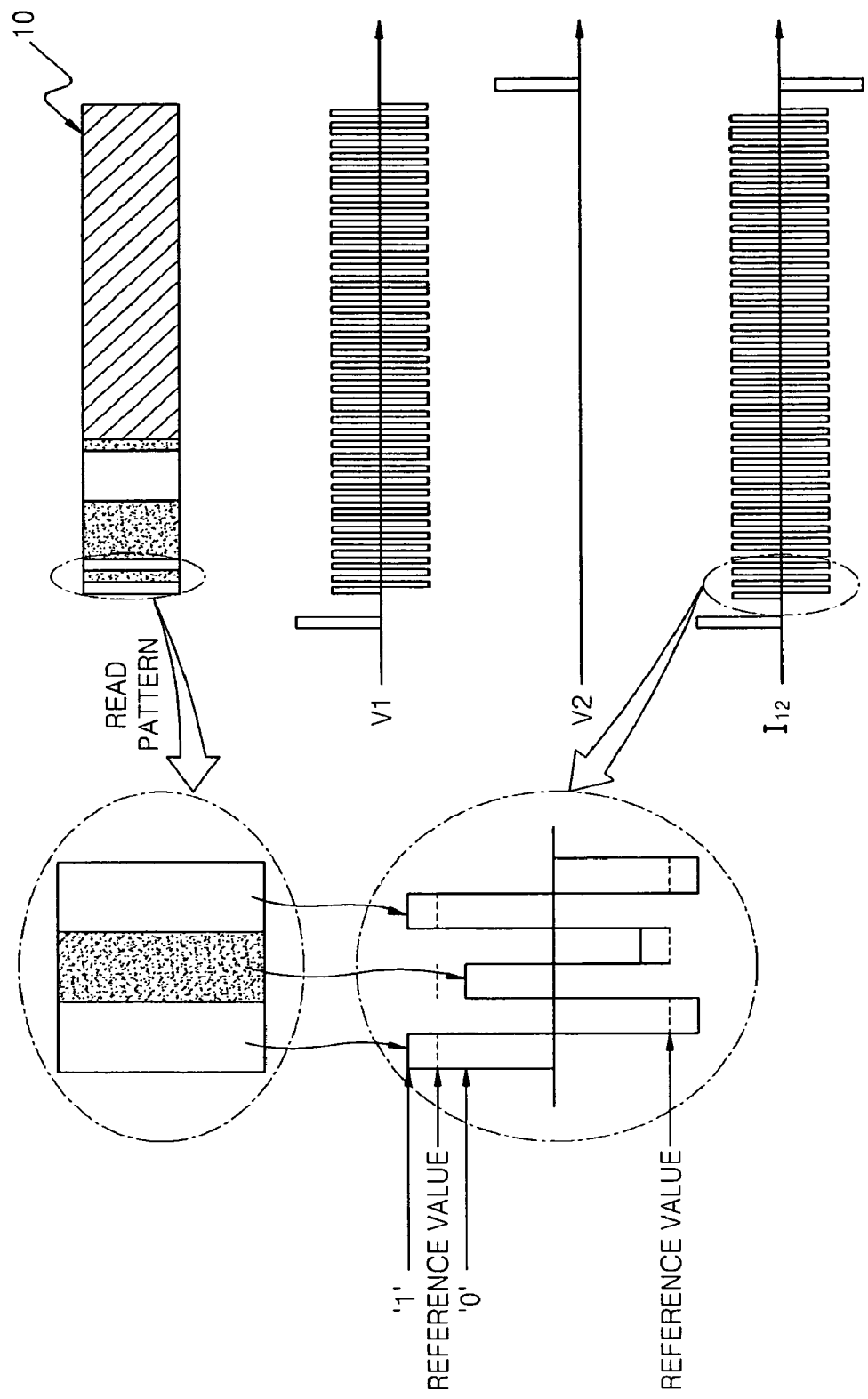
FIG. 6 is a timing chart for explaining a method of reading information according to an embodiment of the present invention.

FIG. 6 is a timing chart for explaining a read operation for reproducing an electric signal from a pattern written using the above-mentioned method.

Referring to FIG. 6, when a pulse voltage for driving the roller 20 is applied to the first track layer 12a, the roller 20 moves over a region having polarizations of a predetermined pattern (READ PATTERN). A predetermined read voltage pulse is continuously applied to the first track layer 12a with a short period. In this case, the second track layer 12b is grounded. Thus, a pulse current $I_{12}$ is flowing between the first and second track layers 12a and 12b due to a potential difference. The amount of current passing through the roller 20 varies according to the polarization direction of polarization domain. That is, as shown in FIGS. 5A and 5B, the magnitude of a pulse current varies depending on the polarization direction of the polarization domain and a difference in magnitude is represented by a bit signal. Bit value "1" is obtained when a current higher than a reference pulse current (reference value) is detected while "0" is obtained when a current lower than the reference value is detected.

A high capacity information storage device can be realized using an integrated array of multiple information storage devices having the above-mentioned construction.

Figure 7A:
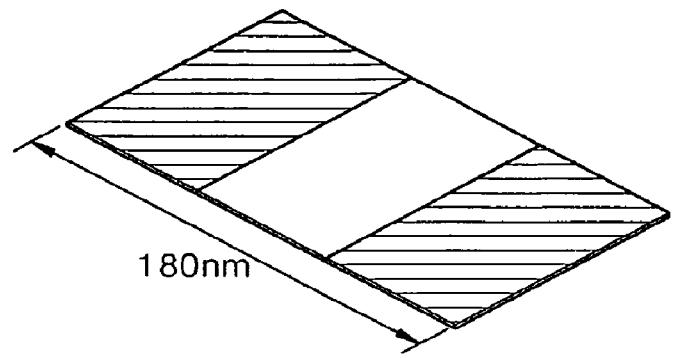
FIG. 7A is a schematic diagram showing an example of an information storage device according to an embodiment of the present invention.
Figure 7B:
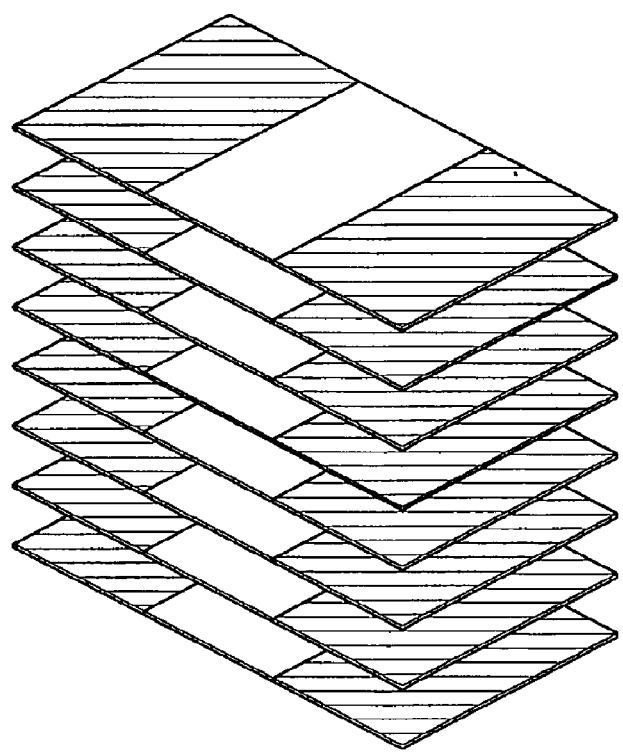
FIG. 7B is a schematic diagram showing another example of an information storage device according to an embodiment of the present invention.

Assuming that 90 bits of information is written to a basic unit having an area of 180 nm*180 nm as shown in FIG. 7A, recording density of about 1.8 Tb/in² can be achieved. In this case, a ferroelectric layer is made of $PbTiO_3$ having a thickness of 1.2 nm and a CNT having a diameter of 2 nm is used as a roller. When the information storage device includes a stack of eight basic units as shown in FIG. 7B, it can offer storage density of about 14 Tb/in².

Figure 8:
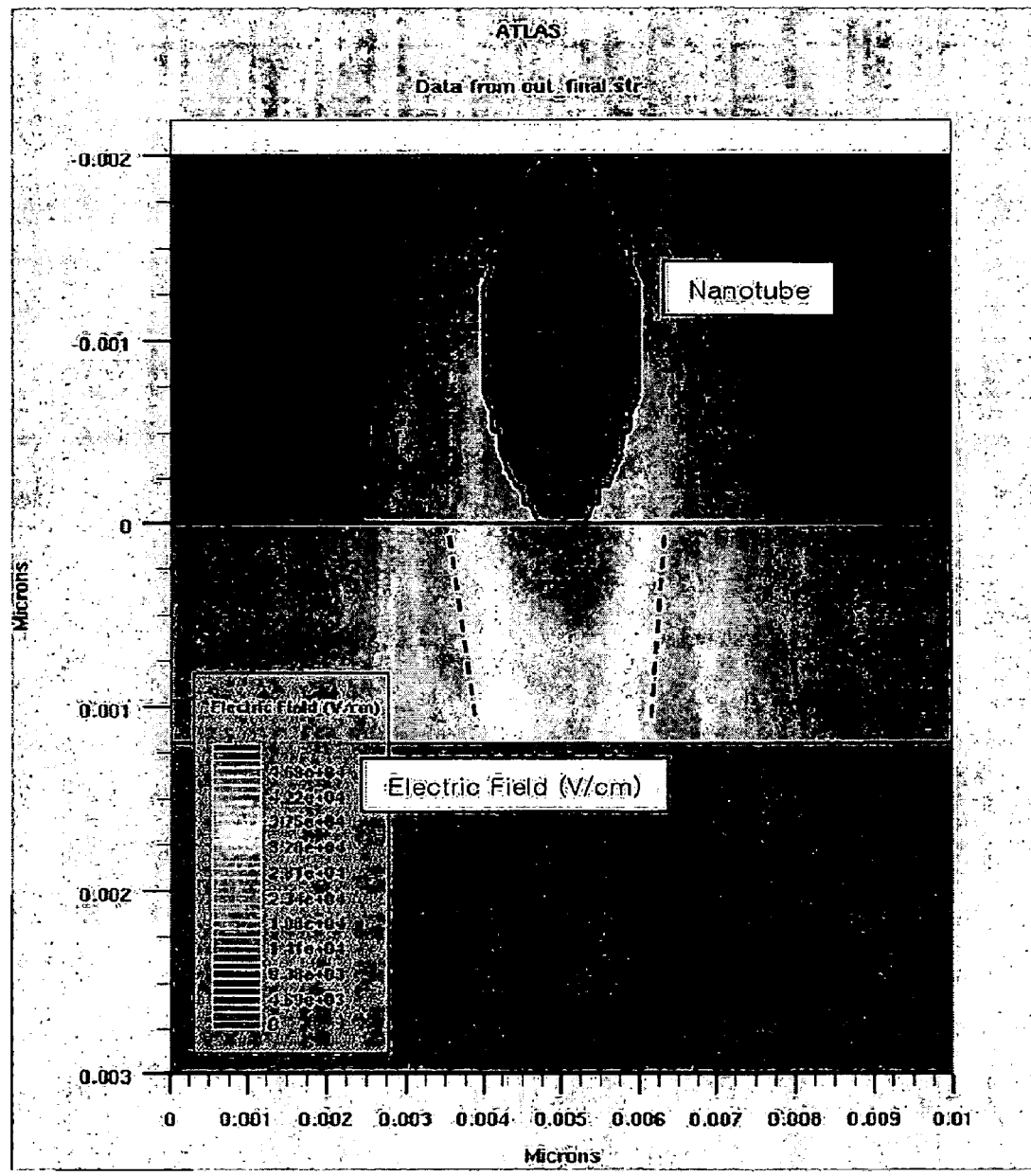
FIG. 8 illustrates the simulation result of electric field distribution in a ferroelectric layer in contact with a nanotube used as a roller in an information storage device according to an embodiment of the present invention.

FIG. 8 illustrates the simulation result of electric field distribution in a ferroelectric layer in contact with a nanotube used as a roller according to an embodiment of the present invention. As evident from FIG. 8, a strong electric field is created around the nanotube and an electric field sufficiently large to induce polarization switching is created at a portion directly beneath the nanotube (inside two dotted lines).

The present invention provides a novel method of writing/reading information to/from the ferroelectric layer. A ferroelectric information storage device according to the present invention achieves very simple design and high-capacity storage. The ferroelectric information storage device is also easy to manufacture and package.

The present invention can be realized as various types of information storage devices and, in particular, is suitable for application to a non-volatile memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An information storage device comprising:
    a ferroelectric layer having a first surface and a second surface opposite the first surface;
    a common electrode layer formed on the first surface of the ferroelectric layer;
    at least two conductive track layers separated from each other and positioned on the second surface of the ferroelectric layer;
    a conductive roller that has two opposite ends supported by the conductive track layers and is movable along a conductive track; and
    a ferromagnetic layer creating a magnetic field on the conductive roller.

2. The information storage device of claim 1, wherein the conductive roller is a nanotube.

3. An information storage device having an integrated array of unit devices, each unit device comprising:
    a ferroelectric layer having a first surface and a second surface opposite the first surface;
    a common electrode layer formed on the first surface of the ferroelectric layer;
    at least two conductive track layers separated from each other and formed on the second surface of the ferroelectric layer;
    a conductive roller that has two opposite ends supported by the conductive track layers and is movable along a conductive track; and
    a ferromagnetic layer creating a magnetic field on the conductive roller.

4. The information storage device of claim 3, wherein the conductive roller is a nanotube.

5. The information storage device of claim 3, wherein the conductive roller is a conductive diamond-like carbon.

6. A method of writing and reading information, comprising:
    generating a Lorentz's force on a conductive roller that is movable over a first surface of a ferroelectric layer to cause the conductive roller to move over the ferroelectric layer;
    applying a predetermined pulse voltage corresponding to recorded information to the ferroelectric layer through the conductive roller to form a polarization domain having a predetermined pattern in the ferroelectric layer and writing desired information to the polarization domain; and
    detecting an electric signal from the polarization domain having the predetermined pattern in the ferroelectric layer and reading the recorded information from the polarization domain.

7. The method of claim 6, wherein current is applied to and a magnetic field is created on the conductive roller in order to generate the Lorentz's force.

8. The method of claim 7, further comprising a ferromagnetic layer formed on a second surface of the ferroelectric layer to create the magnetic field.

9. The method of claim 6, wherein the reading of the recorded information comprises:
    controlling a carrier density and/or mobility in a channel of the conductive roller using the polarization domain formed in the ferroelectric layer while moving the conductive roller over the ferroelectric layer;
    applying a predetermined read voltage to the conductive layer; and
    detecting current whose magnitude varies according to a carrier density and/or mobility in the channel controlled by the polarization domain.

10. The method of claim 9, wherein the read voltage is a pulse voltage.

11. A method of writing and reading information, comprising:
    generating a Lorentz's force on a conductive roller that is movable over a first surface of a ferroelectric layer to cause the conductive roller to move over the ferroelectric layer; and
    applying a predetermined pulse voltage corresponding to recorded information to the ferroelectric layer through the conductive roller to form a polarization domain having a predetermined pattern in the ferroelectric layer and writing desired information to the polarization domain.

12. A method of reading of recorded information comprising:
    controlling a carrier density and/or mobility in a channel of a conductive roller using a polarization domain formed in a ferroelectric layer while moving the conductive roller over the ferroelectric layer;
    applying a predetermined read voltage to the conductive layer; and
    detecting current whose magnitude varies according to a carrier density and/or mobility in the channel controlled by the polarization domain.

13. A method of writing information comprising:
    applying a first pulse voltage to a first track layer;
    creating a Lorenz force by flowing a current between the first track layer and a second track layer;
    causing a roller to move at constant velocity;
    applying a pulse voltage higher than a coercive voltage to the first and the second track layers while the roller is moving;
    applying a voltage higher than a threshold voltage to a ferroelectric layer to form a polarization domain having a direction corresponding to a direction of line of electric force in the ferroelectric layer;
    applying a second pulse voltage of opposite polarity is applied to the first and second track layers to form a polarization domain polarized in a different direction in the ferroelectric layer;
    applying a third pulse voltage having the same level as the first pulse voltage to the second track layer to stop the roller; and
    applying a fourth pulse of opposite polarity to bring the roller to an original position.

14. A method of reading information comprising:
    applying a pulse voltage to a first track layer for moving over a region having polarization;
    applying a read voltage pulse continuously to the first track layer with a short period grounding a second track layer;
    varying an amount of current passing through a roller according to a polarization direction of polarization domain;
    representing a difference in magnitude of the current by a bit signal.

15. The method of claim 14, wherein a bit value "1" is obtained when a current higher than a reference pulse current is detected and a bit value "0" is obtained when a current lower than the reference value is detected.

* * * * *